US010761041B2

(12) United States Patent
Schmidt et al.

(10) Patent No.: US 10,761,041 B2
(45) Date of Patent: Sep. 1, 2020

(54) MULTI-PARALLEL SENSOR ARRAY SYSTEM (71) Applicant: Watlow Electric Manufacturing Company, St. Louis, MO (US)

(72) Inventors: Philip S. Schmidt, Winona, MN (US); Cal T. Swanson, St. Louis, MO (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 238 days.

(21) Appl. No.: 15/819,314

(22) Filed: Nov. 21, 2017

(65) Prior Publication Data
US 2019/0154605 A1    May 23, 2019

(51) Int. Cl.
*G01K 7/16*    (2006.01)
*G01N 27/04*    (2006.01)
(Continued)

(52) U.S. Cl.
CPC .......... *G01N 27/046* (2013.01); *G01K 1/026* (2013.01); *G01K 3/005* (2013.01); *G01K 7/16* (2013.01); *G01N 27/14* (2013.01); *G01R 27/08* (2013.01); *G01J 1/44* (2013.01); *G01L 1/20* (2013.01); *G01N 27/122* (2013.01); *H01L 21/67248* (2013.01)

(58) Field of Classification Search
CPC .......... G01K 3/005; G01K 7/22; G01K 1/026; G01K 7/16; G01K 13/02; G01K 13/00; G01K 7/021; G01N 27/04; G01N 27/046; G01N 27/14
USPC .......... 374/183, 185, 45, 46, 121, 170, 163; 327/512, 513
See application file for complete search history.

(56) References Cited

U.S. PATENT DOCUMENTS

| 2,502,568 A | * | 4/1950 | Hulsberg | G01D 15/10 |
| | | | | 307/112 |
| 2,887,677 A | * | 5/1959 | Arrasmith | G01K 1/024 |
| | | | | 340/963 |

(Continued)

FOREIGN PATENT DOCUMENTS

| CN | 204065300 | 12/2014 |
| CN | 105067929 | 11/2015 |

(Continued)

OTHER PUBLICATIONS

International Search Report for International Application PCT/US2018/061756, dated Mar. 14, 2019.

(Continued)

*Primary Examiner* — Gail Kaplan Verbitsky
(74) *Attorney, Agent, or Firm* — Burris Law, PLLC (57) ABSTRACT The present disclosure relates to a sensing system and method that includes a plurality of resistive elements coupled to a plurality of nodes and a control system configured to index through a plurality of modes to measure an electrical characteristic for each resistive element. Each mode of the plurality of modes represents a different combination of power, return, or open circuit condition applied to each of the plurality of nodes, and the control system is configured to calculate, for each of the modes, a total power consumed by the system and a power consumed by each of the resistive elements based on the measured electrical characteristics, to determine a physical parameter.

26 Claims, 8 Drawing Sheets (51) Int. Cl.
*G01R 27/08* (2006.01)
*G01K 1/02* (2006.01)
*G01N 27/14* (2006.01)
*G01K 3/00* (2006.01)
*G01N 27/12* (2006.01)
*G01L 1/20* (2006.01)
*G01J 1/44* (2006.01)
*H01L 21/67* (2006.01)

(56) References Cited

U.S. PATENT DOCUMENTS

| | | | | |
|---|---|---|---|---|
| 3,453,536 | A * | 7/1969 | Lode | G01K 7/20 |
| | | | | 324/703 |
| 3,752,956 | A | 8/1973 | Cahill et al. | |
| 4,307,606 | A * | 12/1981 | Johnson | G01F 23/247 |
| | | | | 374/189 |
| 4,571,689 | A | 2/1986 | Hildebrand et al. | |
| 5,015,873 | A * | 5/1991 | Hirayama | H01S 5/026 |
| | | | | 326/100 |
| 5,105,065 | A | 4/1992 | Shibata | |
| 5,219,228 | A * | 6/1993 | Ker | F02D 41/1446 |
| | | | | 324/713 |
| 5,414,245 | A * | 5/1995 | Hackleman | B41J 2/1603 |
| | | | | 219/543 |
| 5,993,060 | A * | 11/1999 | Sakurai | G01K 15/00 |
| | | | | 374/1 |
| 6,100,510 | A * | 8/2000 | Chen | H05B 1/0247 |
| | | | | 219/481 |
| 6,392,205 | B1 | 5/2002 | Minonishi | |
| 7,190,357 | B2 * | 3/2007 | Ohta | G09G 3/2011 |
| | | | | 345/100 |
| 7,372,448 | B2 * | 5/2008 | Kim | G01K 1/02 |
| | | | | 345/102 |
| 7,857,505 | B2 * | 12/2010 | Sakima | G01D 3/022 |
| | | | | 374/1 |
| 8,096,708 | B2 | 1/2012 | Harrington | |
| 2003/0066826 | A1 | 4/2003 | Lee et al. | |
| 2004/0232136 | A1 | 11/2004 | Hisaii | |
| 2005/0068214 | A1 * | 3/2005 | Kim | G01K 1/02 |
| | | | | 341/144 |
| 2005/0074051 | A1 * | 4/2005 | Won | G01K 3/005 |
| | | | | 374/170 |
| 2005/0145617 | A1 | 7/2005 | McMillin et al. | |
| 2006/0144516 | A1 | 6/2006 | Ricci et al. | |
| 2006/0289447 | A1 | 12/2006 | Mohamed | |
| 2007/0000918 | A1 | 4/2007 | Steinhauser et al. | |
| 2007/0098041 | A1 * | 5/2007 | Seo | G01K 7/00 |
| | | | | 374/170 |
| 2008/0011737 | A1 | 1/2008 | Fukuoka | |
| 2009/0059461 | A1 | 3/2009 | Yonekura et al. | |
| 2009/0281760 | A1 * | 11/2009 | Taylor | G01K 7/16 |
| | | | | 702/130 |
| 2011/0000426 | A1 | 1/2011 | Herchen | |
| 2011/0092072 | A1 | 4/2011 | Singh et al. | |
| 2015/0063419 | A1 * | 3/2015 | Obayashi | G01K 7/01 |
| | | | | 374/163 |
| 2016/0006416 | A1 * | 1/2016 | Mallinson | H03H 15/02 |
| | | | | 708/301 |
| 2018/0088066 | A1 * | 3/2018 | Schmidt | H01L 21/67103 |
| 2018/0106686 | A1 * | 4/2018 | Furtner | H05B 1/023 |

FOREIGN PATENT DOCUMENTS

| | | |
|---|---|---|
| EP | 1303168 | 4/2003 |
| EP | 1855120 | 11/2007 |
| EP | 2203028 | 6/2010 |
| JP | S61294479 | 12/1986 |
| JP | 2008118052 | 5/2008 |
| WO | 2010/061740 | 6/2010 |
| WO | 2013033340 | 3/2013 |

OTHER PUBLICATIONS

International Search Report for PCT/US2012/053049, dated Dec. 6, 2012.
International Search Report for PCT/US2012/053054, dated Dec. 6, 2012.
International Search Report for PCT/US2012/053067, dated Dec. 6, 2012.
International Search Report for PCT/US2012/053069, dated Dec. 6, 2012.
International Search Report for PCT/US2012/053117, dated Apr. 16, 2013.
International Search Report for PCT/US2012/053137, dated Apr. 16, 2013.
International Search Report for PCT/US2012/053148, dated Jan. 15, 2013.

* cited by examiner

MULTI-PARALLEL SENSOR ARRAY SYSTEM

FIELD

The present application generally relates to a sensing system.

BACKGROUND

The statements in this section merely provide background information related to the present disclosure and may not constitute prior art.

Conventional sensors that measure a physical parameter based on a change in resistance, such as thermocouples or strain gauges, are used in a variety of systems. For example, a thermal system, like pedestal heaters, use thermocouples to monitor the temperature of a heater surface. However, such sensors typically require completely isolated wiring (e.g., one for power and one for return) or separate power wires for each sensor and a common wire shared by all sensors. Thus, these sensors require significant number of wires that can be challenging to integrate in a system in which space or access is limited, such as thermal systems. These and other issues are addressed by the present disclosure.

SUMMARY

This section provides a general summary of the disclosure, and is not a comprehensive disclosure of its full scope or all of its features.

In one form, the present application provides a sensing system. The sensing system includes a plurality of resistive elements coupled to a plurality of nodes and a control system configured to index through a plurality of modes to measure an electrical characteristic for each resistive element. Each mode of the plurality of modes represents a different combination of power, return, or open circuit condition applied to each of the plurality of nodes. The control system is configured to calculate, for each of the modes, a total power consumed by the system and a power consumed by each of the resistive elements based on the measured electrical characteristics, to determine a physical parameter.

In one form, the control system is configured to calculate resistance of the resistive elements based on the total power consumed, the power consumed by each of the resistive elements, and pre-stored algorithms.

In another form, the control system is configured to determine at least one of temperature, strain, light intensity, or gas concentration as the physical parameter of the sensing system based on the calculated resistance.

In yet another form, the control system is configured to determine the physical parameter based on the resistance of the resistive elements and predetermined correlation information that associates one or more resistance values to one or more values of the physical parameter.

In one form, the control system uses Moore-Penrose pseudoinverse to determine the resistance of the resistive elements.

In another form, the control system is configured to test for an open or short circuit condition.

In yet another form the control system is configured to compute derivative sensor information such as gradients and rates of change.

In yet another form, the control system is configured to determine exceeding temperature ranges of the sensing system.

In another form, the electrical characteristic includes voltage and current.

In yet another form, the control system is configured to calculate a total conductance of the plurality of resistive elements based on the total power consumed by the sensing system and the power consumed by each of the resistive elements.

In another form, the number of plurality of modes is greater than or equal to the number of resistive elements.

In yet another form, each of the resistive elements is connected between a pair of nodes from the plurality of nodes.

In another form, the resistive elements are comprised of an electrically conductive material with a temperature dependent electrical resistance.

In one form, each mode has a set of voltages that are linearly independent of each other.

In another form, the control system communicates at least one of the electrical characteristics or the physical parameter to an external device by way of a network controller.

In one form, a method for measuring temperature of a sensing system having a plurality of resistive elements coupled to a plurality of nodes is provided. The method includes indexing through a plurality of modes to measure an electrical characteristic for each resistive element. Each mode of the plurality of modes represents a different combination of power, return, or open circuit condition applied to each of the plurality of nodes. The method includes calculating, for each of the modes, a total power consumed by the sensing system and a power consumed by each of the resistive elements based on the measured electrical characteristics, to determine a physical parameter of the sensing system.

In another form, the method includes calculating the resistance of the resistive elements based on the total power consumed by the sensing system and the power consumed by each of the resistive elements. The method includes determining the physical parameter based on the resistance of the resistive elements and predetermined correlation information that associates one or more resistance values to one or more values of the physical parameter.

In yet another form, resistance of the resistive elements is calculated using Moore-Penrose pseudoinverse.

In another form, the physical parameter is at least one of temperature, strain, light intensity, or gas concentration.

In one form, the electrical characteristics include voltage and current.

In another form, the method includes calculating a total conductance of the plurality of thermal elements based on the total power consumed by the sensing system and the power consumed by each of the resistive elements.

In another form, each of the resistive elements is connected between a pair of nodes from the plurality of nodes.

In yet another form, the method determines exceeding temperature ranges of the sensing system.

In another form, the method includes testing for an open or short circuit condition.

In one form, the method includes computing derivative sensor information such as gradients and rates of change.

In another form, each mode has a set of voltages that are linearly independent of each other.

Further objects, features and advantages of this application will become readily apparent to persons skilled in the art after a review of the following description, with reference to the drawings and claims that are appended to and form a part of this specification.

BRIEF DESCRIPTION OF THE DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
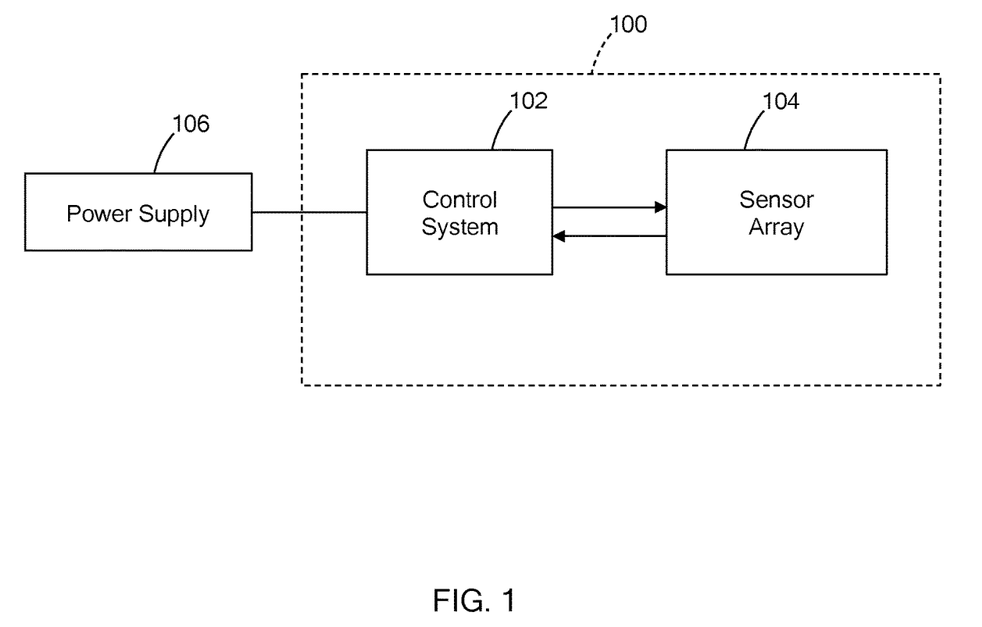
FIG. 1 is a block diagram of a sensing system in accordance with teachings of the present disclosure.

Referring to FIG. 1, a sensor array system 100, which may also be referred to as a sensing system, measures a physical parameter based on a resistance of an element whose resistance value varies with a change in the physical parameter. In one form, the sensing system 100 includes a control system 102 and a multi-parallel sensor array 104 (i.e., a sensor array) having a plurality of resistive elements (not shown). As described further herein, the control system 102 operates the sensor array 104 in accordance with one or more sensing modes in which power is applied to the sensor array 104 from a power supply 106. The control system 102 is configured to determine a value of the physical parameter based on a resistance of the sensor array 104. More particularly, the control system 102 calculates the resistance of the resistive elements of the sensor array 104 based on measured electrical characteristics and on the total power consumed by the sensor array 104. Using the calculated resistance, the control system 102 determines a value of the physical parameter.

The sensing system 100 can be applied to a variety of systems to measure physical parameters, such as temperature, physical deformation (i.e., strain), light intensity, or gas concentration. In one example, the sensing system of the present disclosure is used to measure a temperature profile across a surface of a heater used for semiconductor processing. Such a heater system is described in pending U.S. application Ser. No. 13/598,995 filed on Aug. 30, 2012, which is commonly assigned with the present application and the disclosures of which is incorporated herein by reference in their entirety.

Figure 2:
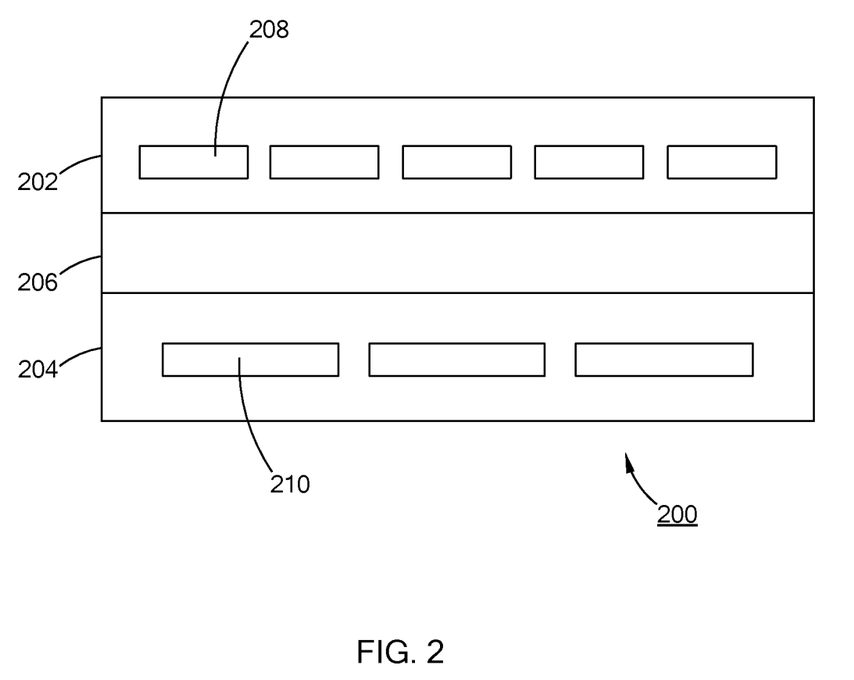
FIG. 2 is a partial side view of a heater comprising a routing layer, a base heater layer, and a sensor array constructed in accordance with principles of the present disclosure.

As an example, FIG. 2, illustrates a heater 200 for a semiconductor processor. The heater 200 includes a sensor array 202 disposed above a base heater layer 204 with a routing layer 206 disposed between the base heater layer 204 and the sensor array 202. The sensor array 202 includes multiple resistive elements 208, and the base heater layer 204 includes one or more heater circuits 210 that are operable to generate heat. The routing layer 206 is configured to route power lines that extend from the base heater layer 204 to the sensor array 202. For example, the base heater layer 204 defines one or more apertures (not shown) that extend through the base heater layer 204, and the routing layer 206 defines a cavity (not shown) that is in communication with the apertures. Power lines are routed through the apertures of the base heater layer 204 to the internal cavity of the routing layer 206. From the internal cavity, the power lines are connected to the sensor array 202. In one form, the sensor array 202 is used to monitor the temperature of the heater 200 using the teachings of the present disclosure.

The sensing system of the present disclosure can be used with other systems and should not be limited to heaters for semiconductor processing, i.e. mechanical systems. In addition, the sensor array can be used to measure other physical parameters, and should not be limited to temperature. For example, an array of strain gauges may be coupled to structural components of bridges, buildings, and other mechanical systems to take strain measurements, thereby reducing the amount of wires required for taking the measurements.

A sensor array of the sensing system includes a plurality of resistive elements that are coupled to a plurality of power nodes. Each node may then be coupled to a power line for receiving power, return, or being placed in an open condition. For example, referring to FIG. 3, a sensor array 300 includes six resistive elements $310_1$ to $310_6$, which are collectively referred to as resistive elements 310, and four power nodes $320_1$ to $320_4$, which are collectively referred to as power nodes 320. The resistive elements 310 are arranged in a multi-parallel fashion across pairs of power nodes 320. As such, each power node 320 has one resistive element 310 connected between itself and each of the other power nodes 320, and each resistive element 310 is connected between a pair of power nodes from the plurality of power nodes 320.

Figure 3:
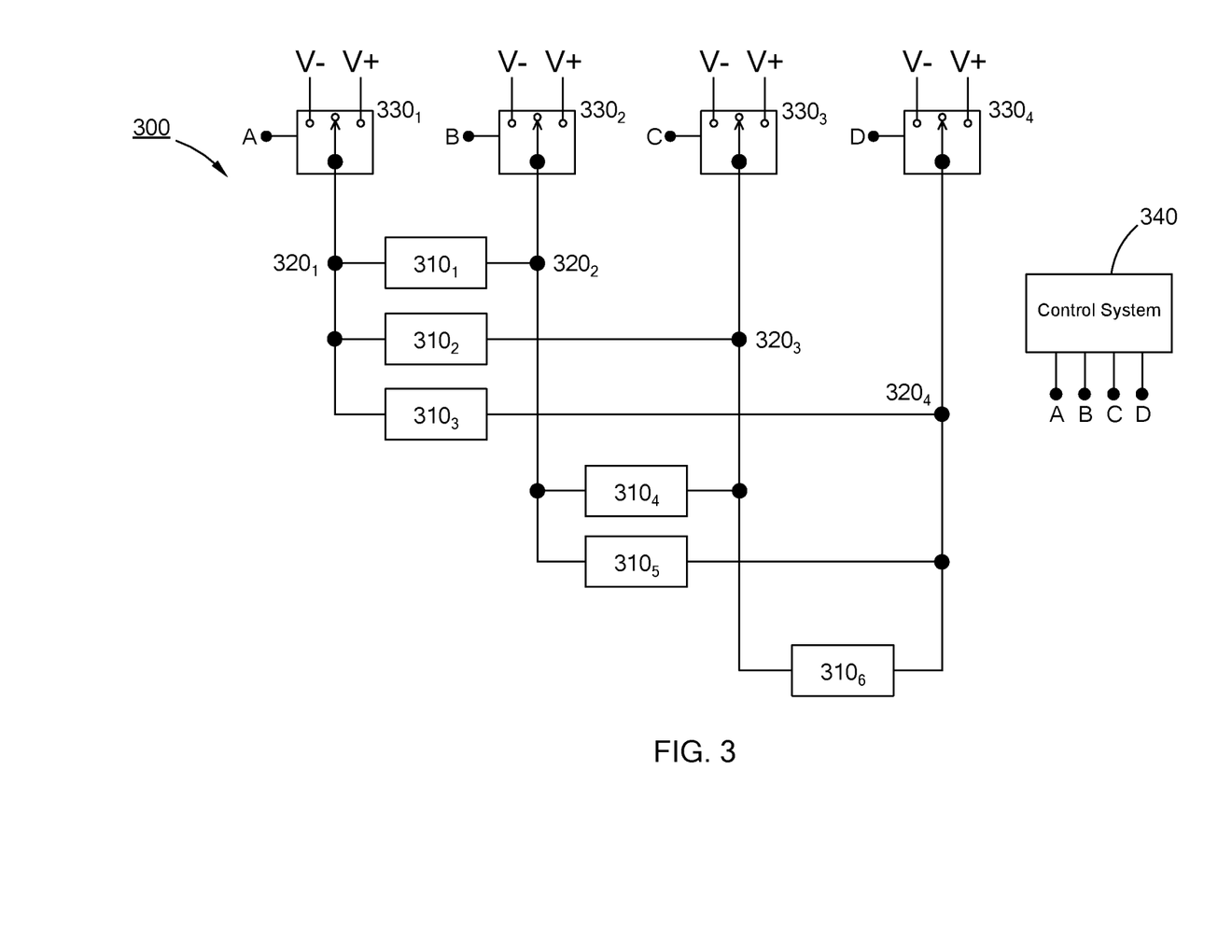
FIG. 3 is a schematic of a sensing system in accordance with principles of the present disclosure.

Accordingly, resistive element $310_1$ is connected between power nodes $320_1$ and $320_2$, resistive element $310_2$ is connected between power nodes $320_1$ and $320_3$, resistive element $310_3$ is connected between power nodes $320_1$ and $320_4$, resistive element $310_4$ is connected between power nodes $320_2$ and $320_3$, resistive element $310_5$ is connected between power nodes $320_2$ and $320_4$, and resistive element $310_6$ is connected between power nodes $320_3$ and $320_4$. While FIG. 3 illustrates a sensor array having six resistive elements and four power nodes, the sensor array may be configured in other suitable ways to have two or more resistive elements and two or more power nodes.

As discussed above, the resistive elements 310 are sensors or devices whose resistance is dependent on a physical property. For example, the resistive elements 310 are any one of resistance temperature detectors (RTDs), thermistors, strain gauges, photocells, and/or gas sensors, among others. The resistances of such devices vary due to one or more of the following physical properties: temperature; physical deformation; light intensity; and gas concentration, among others. By calculating the resistance of the resistive elements 310, the value of the physical property may also be determined as set forth in greater detail below.

In one form, the system 300 further includes a plurality of switches that are operable to electrically couple the plurality of power nodes 320 to one of return (V−), power (V−), or open circuit condition. For example, in FIG. 3, four switches 330₁ to 330₄, which are collectively referred to as switches 330, are coupled to the power nodes 320, such that each power node 320 is coupled to one switch 330 to selectively apply one of return (V−), power (V−), or open circuit condition to the power node. The switches 330 may be a circuit of discreet elements including, but not limited to, transistors, comparators and SCR's or integrated devices for example, microprocessors, field-programmable gate arrays (FPGA's), or application specific integrated circuits (ASIC's).

Figure 4:
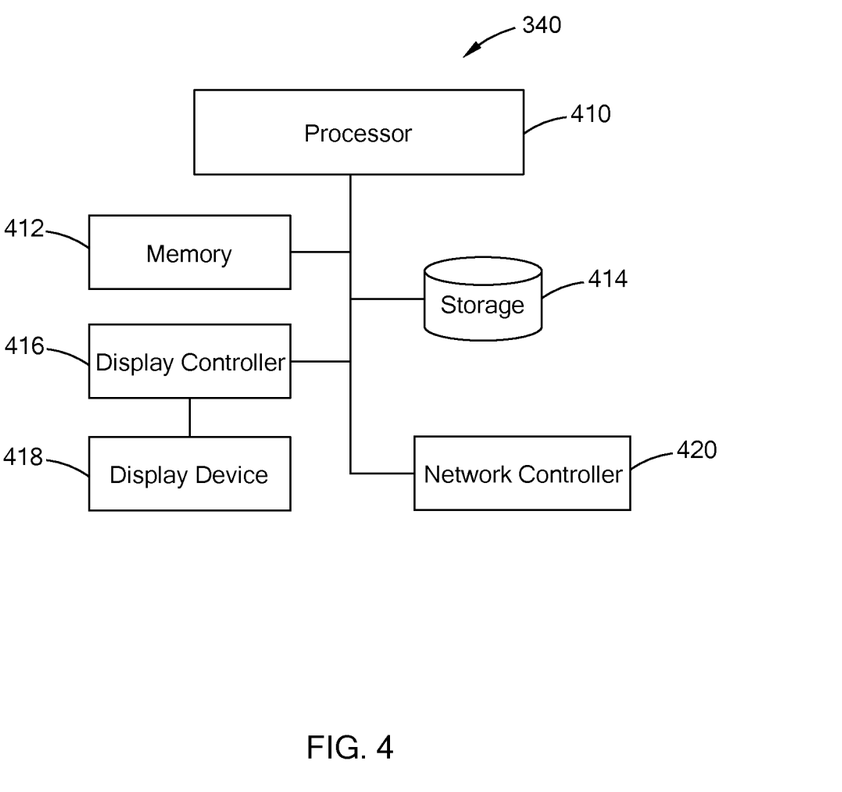
FIG. 4 is a block diagram of a control system in accordance with principles of the present disclosure.

A control system 340 is configured to operate the sensor array 300, and is implemented as a computer system. For example, FIG. 4 illustrates the control system 340 as a computer system that includes a processor 410 for executing instructions such as those described in the routing described below. The instructions may be stored in a computer readable medium such as memory 412 or storage devices 414, for example a disk drive, CD, or DVD. The computer may include a display controller 416 responsive to instructions to generate a textual or graphical display on a display device 418, for example a computer monitor. In addition, the processor 410 may communicate with a network controller 420 having a data port to communicate data or instructions to other systems, for example other general computer systems. The network controller 420 may communicate over Ethernet or other known protocols to distribute processing or provide remote access to information over a variety of network topologies, including local area networks, wide area networks, the Internet, or other commonly used network topologies.

In one form, the control system 340 is configured to determine the physical property detected by the resistive element 310 based on the resistance of the resistive elements 310 and on predetermined information that correlates one or more resistance values with values of the physical property. As described further herein, the control system 340 determines the resistance by measuring electrical characteristics of the resistance elements 310 at different modes. That is, in one form, the control system 340 operates the switches 330 to selectively apply power to the power nodes 320, and index through a plurality of sensing modes to measure electrical characteristics of the resistive elements 310. Sensing modes are an application of voltages and/or current to the power nodes that result in some distribution of power through the network. The amount of power applied to the power nodes can be selected based on the system, but is generally low enough to measure voltage and/or current through the resistive elements, such as 2-5 Vs.

In one form, the resistance of the resistive elements 310 is determined based on the power consumed by the sensor array. By way of explanation, the sensor array of FIG. 3 is represented as the network diagram shown in FIG. 5 in which six resistors (i.e., g1, g2, g3, g4, g5, and g6) are coupled to four nodes (a, b, c, d). From the network the following variables and relationships are established.

Figure 5:
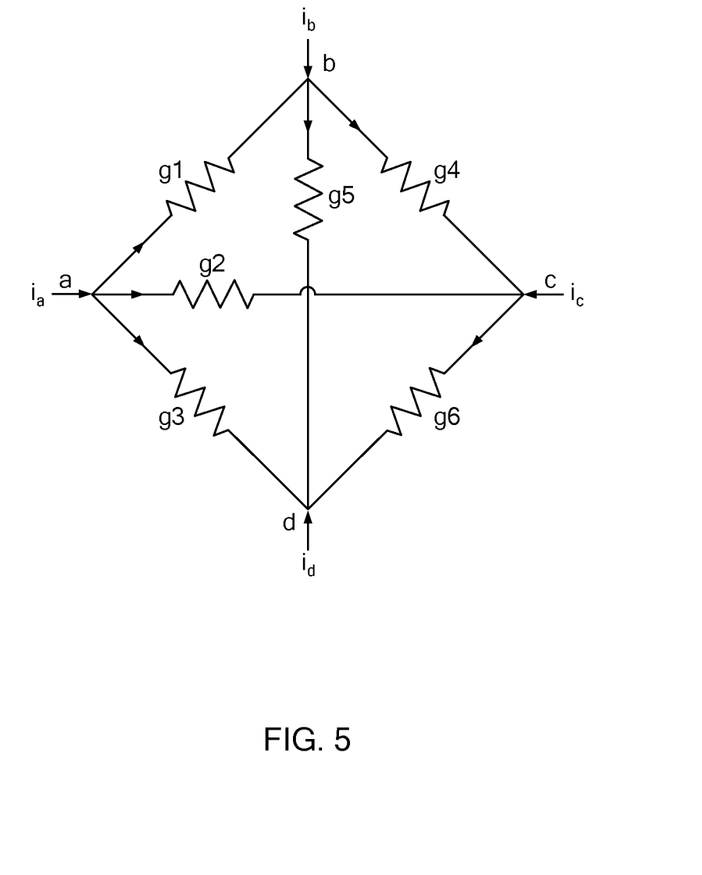
FIG. 5 is a network diagram of the multi-parallel sensor array of FIG. 3.

$i_w = [i_a i_b i_c i_d]^T$      Wire currents:

$v_w = [v_a v_b v_c v_d]^T$      Wire voltages:

$g = [g_1 g_2 g_3 g_4 g_5 g_6]^T$      Conductances:

$i_G = [i_1 i_2 i_3 i_4 i_5 i_6]^T$      Currents through conductances:

$v_G = [v_1 v_2 v_3 v_4 v_5 v_6]^T$      Voltages across conductances:

$$i_w = \begin{bmatrix} 1 & 1 & 1 & 0 & 0 & 0 \\ -1 & 0 & 0 & 1 & 1 & 0 \\ 0 & -1 & 0 & -1 & 0 & 1 \\ 0 & 0 & -1 & 0 & -1 & -1 \end{bmatrix} i_G = R i_G$$

$$v_G = \begin{bmatrix} 1 & -1 & 0 & 0 \\ 1 & 0 & -1 & 0 \\ 1 & 0 & 0 & -1 \\ 0 & 1 & -1 & 0 \\ 0 & 1 & 0 & -1 \\ 0 & 0 & 1 & -1 \end{bmatrix} v_w = D v_w$$

$$i_G = \begin{bmatrix} g_1 & 0 & 0 & 0 & 0 & 0 \\ 0 & g_2 & 0 & 0 & 0 & 0 \\ 0 & 0 & g_3 & 0 & 0 & 0 \\ 0 & 0 & 0 & g_4 & 0 & 0 \\ 0 & 0 & 0 & 0 & g_5 & 0 \\ 0 & 0 & 0 & 0 & 0 & g_6 \end{bmatrix} v_G = \mathrm{diag}(g) v_G = G v_G$$

$$i_w = RGDv_w = \begin{bmatrix} g_1+g_2+g_3 & -g_1 & -g_2 & -g_3 \\ -g_1 & g_1+g_4+g_5 & -g_4 & -g_5 \\ -g_2 & -g_4 & g_2+g_4+g_6 & -g_6 \\ -g_3 & -g_5 & -g_6 & g_3+g_5+g_6 \end{bmatrix} v_w$$

In one form, the power consumed by the entire array for any given mode is determined by Equation 1 in which the "∘" operator designates an element-by-element multiplication (i.e., a Hadamard product) and the row vector "s" is defined to be the squares of the leg voltages (i.e., $s=(v_g \circ v_g)^T$).

$$p = i_w^T v_w = (v_g \circ v_g)^T g = ((Dv_w) \circ (Dv_w))^T g = sg \quad \text{Equation 1}$$

More particularly, in one form, the total network power is determined using Equations 2 or 3 which use measured wire voltages $V_i$ and measured wire currents $I_i$. In Equations 2 and 3, $$g_{ij} = \frac{1}{R_{ij}};$$

w is the number of wires. By setting the equations to each other, as shown in Equation 4, the conductance (g) of a resistive element, and thus, the resistance (R=1/g) is determined.

$$P_{total} = \sum V_i I_i \quad \text{Equation 2}$$

$$P_{total} = \sum_{\substack{i=1,w-1 \\ j=i+1,w}} g_{ij}(V_i - V_j)^2 \quad \text{Equation 3}$$

$$\sum V_i I_i = \sum_{\substack{i=1,w-1 \\ j=i+1,w}} g_{ij}(V_i - V_j)^2 \quad \text{Equation 4}$$

To determine the resistance of each of the resistive elements, multiple measurements may be taken. For example, if there are "n" number of resistive elements, at least "n" number of measurements should be taken to obtain "n" number of measurements of wire voltages $V_i$ and currents $I_i$. These measurements are taken during the application of the sensing modes, where each sensing mode has voltages that are linearly independent of each other. In one form, the number of sensing modes is greater than or equal to the number of resistive elements.

Using vector-matrix notation, Equation 1 is rewritten as Equation 5 for the k'th mode, and Equation 6 represents the matrix for all the mode equations. From Equation 6, the resistance of the resistive elements is calculated by solving for g using Equation 7 and taking the reciprocal of the conductance.

$$p_k = s_k g_k, \text{ where}$$

$$p_k = \sum V_i I_i$$

$$s_k = \begin{bmatrix} (V_1 - V_2)^2 \\ \vdots \\ (V_{w-1} - V_w)^2 \end{bmatrix}^T$$

$$g_k = \begin{bmatrix} g_{12} \\ \vdots \\ g_{w-1,w} \end{bmatrix}$$

Equation 5

$$\begin{bmatrix} p_1 \\ \vdots \\ p_m \end{bmatrix} = \begin{bmatrix} s_1 \\ \vdots \\ s_m \end{bmatrix} g \text{ or } p = Sg,$$

Equation 6 where m is the number of modes $$g = S^{-1}p, R = 1/g$$

Equation 7

The control system 340 is configured to index through "m" number of modes which is greater than or equal to the number of resistive elements, to obtain m measurements. When the number of modes is equal to the number of a resistive elements, or in other words, when the S matrix is square and full rank, the conductance (g) is solved using Equation 7. Alternatively, when the number of sensing modes is greater than the number of resistive elements (i.e., is not square and has full rank), then Moore-Penrose pseudo-inverse is used to obtain to $g=S^+p$. Since the pseudoinverse is equal to the inverse when S is invertible, the latter equation is used to determine g as long as S is full column rank.

In one form, the sensing system includes measurement noise in $i_w$ and $v_w$ as well as numerical errors in computing $S^+p$. Assuming that g is constant, or approximately so, for the whole set of measurements, in one form, the noise and error be reduced by taking additional power samples and using linear regression (i.e., $g=(S^TS)^{-1}S^Tp$) to estimate g. If g is not constant, that is, $g=(f(x))$ for some parameter vector x, then a numerical nonlinear least squares method is used to estimate g.

Once the control system 340 calculates the resistance of the resistive elements, a value of the physical parameter is determined using, for example, predetermined information, such as a look-up table, that associates resistance values to values of the physical parameters. For example, if the resistive elements are thermistors, a look up table or algorithm is used to determine the temperature associated with the calculated resistance.

Various configurations of the control system 340 may include determining exceeding physical parameter ranges of the system, testing for an open or short circuit condition, and/or computing derivative sensor information such as gradients and rates of change. For example, the control system 340 is configured to determine exceeding ranges of temperature, pressure, light intensity, gas concentration, etc., by comparing the measured values of the physical parameter to predetermined limit values. In the event that the measured values are greater than the predetermined limit value, the control system 340 can be configured to issue an alert notification.

The control system 340 can be configured in various suitable ways to test for an open or short circuit conditions. For example, in one form, an open circuit condition is detected when the measured resistances are at high orders of magnitude and are approaching infinity. Short circuit conditions on the other hand is detected when the power node currents exceed predetermined values.

As mentioned above, the control system 340 may also be configured to compute derivative sensor information such as gradients. For example, in one form, the control system 340 computes gradients by taking a consecutive series of at least two of the measured resistances and applying gradient computational algorithms such as finite difference, exact curve fit, and/or least-squares curve fit, just to name a few, and comparing them with the derivative.

The control system 340 of the sensor array may be configured in various suitable ways to index through multiple sense modes to calculate the resistance of the resistive elements. An example operation of the system having the multi-parallel sensor array is described with reference to FIGS. 6, 7, and 8A to 8C.

Figure 6:
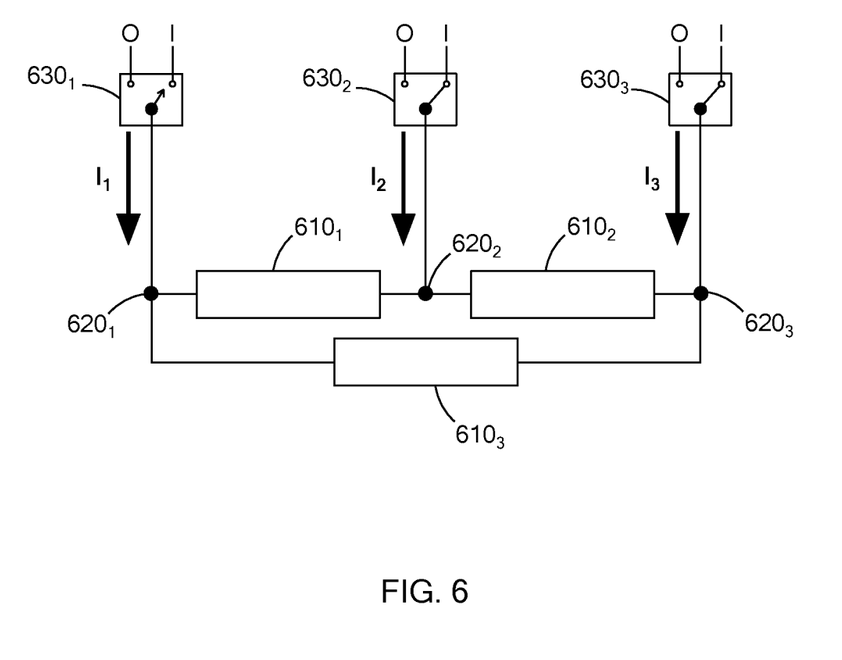
FIG. 6 is an example schematic of a three-wire multi-parallel sensor array in accordance with the principles of the present disclosure.

FIG. 6, illustrates a multi-parallel sensor array 600 having three resistive elements 610$_1$, 610$_2$, and 610$_3$, which are collectively referred to as resistive elements 610, and three power nodes 620$_1$, 620$_2$, and 620$_3$, which are collectively referred to as power nodes 620. Like the multi-sensor array described above, each resistive element 610 is coupled to a pair of nodes 620, and each power node 620 is operable to apply power, return, or set in an open circuit condition by way of, for example, a switch 630 (i.e., switches 630$_1$, 630$_2$, and 630$_3$ in the figure). In the following, resistive elements 610$_1$, 610$_2$, and 610$_3$ may also be referenced as $R_{12}$, $R_{23}$, and $R_{13}$, respectively, where the numbers identify the power nodes to which the respective resistive element is connected between.

In one form, a control system, which is similar to control system 340, operates the switches 630 based on a plurality of sensing modes. For example, the control system is configured to operate the sensor array 600 based on three sensing modes (K1, K2, and K3), which are defined in Table 1 below, for determining the resistances of the three resistive elements 610. In Table 1, power nodes 620$_1$, 620$_2$, and 620$_3$ are represented by PN1, PN2, and PN3, respectively. The values 0 and 1 represent return and power, respectively, and for each sensing mode, a different combination of power and return is applied to the power nodes 620. In another form, the control system is configured to apply more than three sensing modes that include different combinations of power, return, and/or open circuit condition, and should not be limited to the three sensing modes provided below.

TABLE 1

| Sensing Modes | | | |
|---|---|---|---|
| | Node Operation | | |
| Modes | PN1 | PN2 | PN3 |
| K1 | 0 | 0 | 1 |
| K2 | 0 | 1 | 0 |
| K3 | 1 | 0 | 0 |

Figure 7:
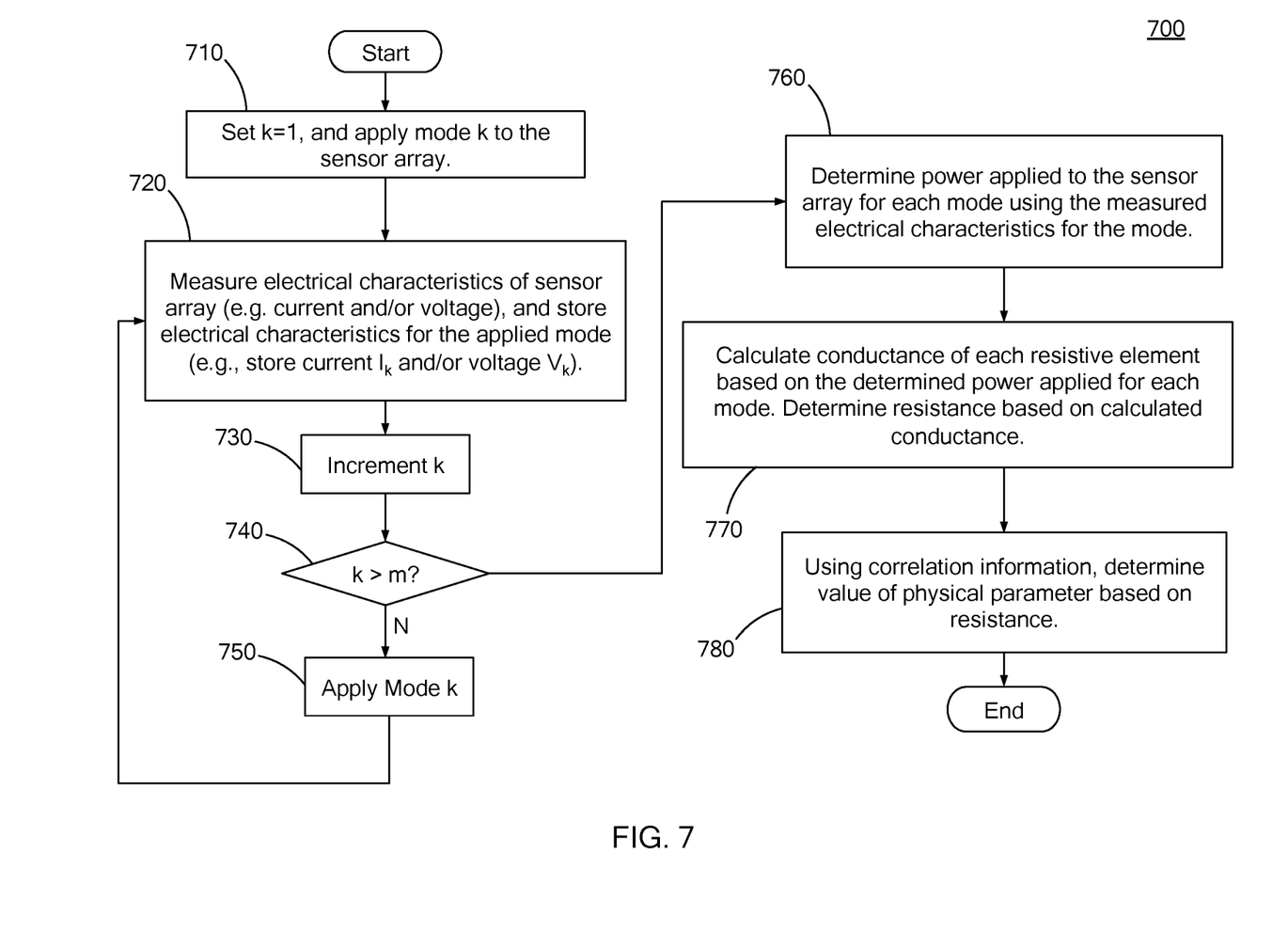
FIG. 7 is a flowchart illustrating a method for calculating the total power for the multi-parallel sensor array in accordance with principles of the present disclosure.

FIG. 7 illustrates an example sensing routine 700 to be performed by the control system to calculate the resistance of each resistive element 610 based on electrical characteristics measured during the three sensing modes. More particularly, to demonstrate the resistance measurement feature of the sensing system, for the following example, it is assumed that the resistances of the resistive elements $610_1$, $610_2$, and $610_3$ are 1Ω, 3Ω, and 2Ω, respectively.

At 710, the control system sets the kth mode to 1 and applies mode K1 to the sensor array 600. Accordingly, the nodes PN1 and PN2 are coupled to return, and PN3 is coupled to power. For brevity, power is provided as 1V.

In operation, at 720, the control system measures and stores the electrical characteristics of the sensor array 600 for the applied mode. For example, the control system measures the electric current flowing through each of the power nodes $620_1$, $620_2$, $620_3$ as $i_1$, $i_2$, and $i_3$, respectively, and the voltage applied to the nodes. Here, for explanation purposes only, the electric current through the power nodes 620 are calculated using the known resistance values of the resistive elements 610 and the voltages applied to the nodes 620. For example, the current through node $620_1$ is $i_1=$ $$\frac{v_1 - v_2}{R_{12}} + \frac{v_1 - v_3}{R_{13}} = -0.500 A,$$

in which $R_{12}$ and $R_{13}$ are the resistance of resistive elements $610_1$ and $610_3$, respectively. Using similar calculations, the current through power nodes $620_2$ and $620_3$ is determined as $i_2=-0.333$ A and $i_3=0.833$ A, respectively.

Referring to FIG. 7, at 730 the control system increments k, and determines if k is greater than the total number of modes (i.e., k>m), at 740. That is, the control system determines whether the sensor array has been indexed through all the modes. If k is less than the total number modes, the control system applies mode k to the sensor array at 750 and returns to 720 to measure the electrical characteristics. As it relates to the sensor array 600, from mode K1, the control system applies modes K2 and K3, and measures and stores the electrical characteristics of the sensor array 600. Table 2 below summarizes the current through each power node for each of the modes.

TABLE 2

| | Electric Current | | |
| --- | --- | --- | --- |
| Modes | $i_1$ | $i_2$ | $i_3$ |
| K1 | −0.500 | −0.333 | 0.833 |
| K2 | −1.000 | 1.333 | −0.333 |
| K3 | 1.500 | −1.000 | −0.500 |

Figure 8A:
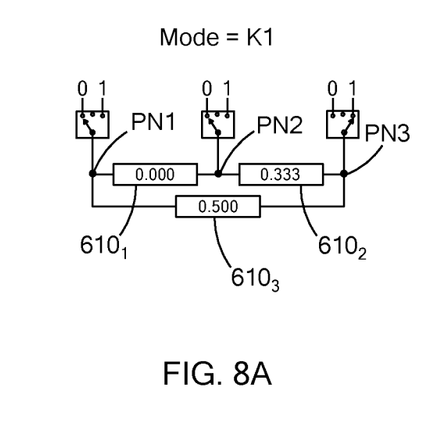
FIG. 8A-8C are schematics exemplifying calculations for the three-wire multi-parallel thermal array of FIG. 6 with varied sensing modes in accordance with the principles of the present disclosure.
Figure 8B:
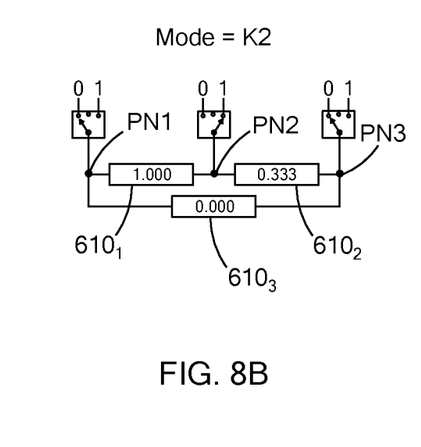
Figure 8C:
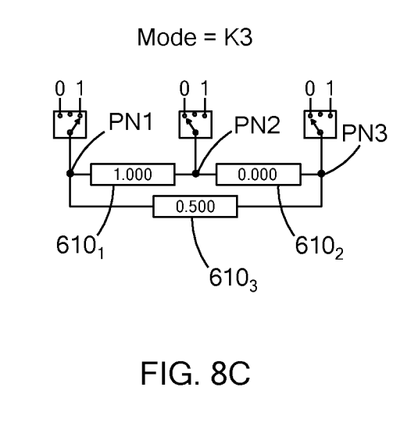

When the control system has indexed through all of the modes, the control system, at 760, calculates the total power generated by the sensor array 600 for each of the modes K1, K2, and K3 using Equation 2. For example, for mode K1 the total power is $p_1=i_1v_1+i_2 v_2+i_3 v_3=0.833$ W. Similarly, the total power for modes K2 and K3 are equal to $p_2=1.333$ W and $p_3=1.500$ W. Here, since the resistance of the resistive elements 610 are known, the total power can be verified by taking the sum of the power applied to each resistive element 610 during each mode. For example, FIGS. 8A, 8B, and 8C illustrate the power applied to each resistive element 610 for modes K1, K2, and K3, respectively. As illustrated, the total power for mode K1 is $p_1=p_{R12}+p_{R13}+p_{R23}=0.000+0.500+0.333=0.833$ W, which is the same as $p_1=i_1v_1+i_2 v_2+i_3 v_3=0.833$ W. Accordingly, the total power (p) for modes K1, K2, and K3 are $p_1$, $p_2$, and $p_3$ and represented in the following matrix.

$$p = \begin{bmatrix} p_1 \\ p_2 \\ p_3 \end{bmatrix} = \begin{bmatrix} 0.833 \\ 1.333 \\ 1.500 \end{bmatrix}$$

From 760, the control system solves for conductance using Equations 6 and 7, at 770. That is, the control system calculates conductance of the resistive elements based on the power determined and the voltages applied to the resistive elements for each mode. For example, with respect to sensor array 600, for each mode, $s_i=[v_{12_i}^2\ v_{13_i}^2\ v_{23_i}^2]$, and the S matrix encompassing all of the modes is a full-square matrix and is provided below. Furthermore, to determine the conductance as provided in Equation 7, the inverse of the S matrix is determined and multiplied by the power matrix (p) resulting in the conductance for each resistive element 610.

$$S = \begin{bmatrix} 0 & 1 & 1 \\ 1 & 0 & 1 \\ 1 & 1 & 0 \end{bmatrix}$$

$$S^{-1} = 0.5 \begin{bmatrix} -1 & 1 & 1 \\ 1 & -1 & 1 \\ 1 & 1 & -1 \end{bmatrix}$$

$$g = S^{-1} p = 0.5 \begin{bmatrix} -1 & 1 & 1 \\ 1 & -1 & 1 \\ 1 & 1 & -1 \end{bmatrix} \begin{bmatrix} 0.833 \\ 1.333 \\ 1.500 \end{bmatrix} = \begin{bmatrix} 1.000 \\ 0.500 \\ 0.333 \end{bmatrix}$$

$$R = 1/g \rightarrow \begin{bmatrix} R_{12} \\ R_{13} \\ R_{23} \end{bmatrix} = \begin{bmatrix} 1 \\ 2 \\ 3 \end{bmatrix}$$

Based on the above, the resistance of the resistive elements $610_1$ ($R_{12}$), $610_2$ ($R_{23}$), and $610_3$ ($R_{13}$) are calculated to be 1Ω, 3Ω, and 2Ω. Accordingly, as demonstrated herein, by operating the sensor array 600 in accordance with the three sensing modes provided in Table 1, the resistances of resistive elements 610 are calculated based on the electrical characteristics taken during those modes. During operation, the control system is configured to measure the electrical characteristics (i.e., measure the current and voltage applied to each node for each of the modes). This data is then used to determine the total power consumed and then the resistance using the algorithms described herein.

With continuing reference to FIG. 7, using the resistance, the control system at 780, determines the physical parameter detectable by the resistive element 610 using predetermined correlation information, which may include but is not limited to algorithms and/or look-up tables.

The sensing system of the present disclosure is configured to measure temperature at multiple regions with a reduced number of wires to connect the sensor array to power. Specifically, each resistive element is a sensor for measuring a physical parameter, and with the multi-parallel configuration a sensor array having, for example, six sensors requires four wires. Conversely, conventional systems in which the sensors share a common node, still require 7 wires. Furthermore, the physical parameter is determined based on a calculated resistance, which is further based on the power of the system.

In accordance with teachings of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Further, the methods described herein may be embodied in a computer-readable medium. The term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In other embodiments, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

Further, it is noted that any of the topologies described may be used with any of the processing methods. Additionally, any the features described with respect to one topology or method may be used with the other topologies or methods.

In accordance with teachings of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Further, the methods described herein may be embodied in a computer-readable medium. The term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

As a person skilled in the art will readily appreciate, the above description is meant as an illustration of the principles of the invention. This description is not intended to limit the scope or application of the invention in that the invention is susceptible to modification, variation and change, without departing from spirit of the invention, as defined in the following claims.

We claim:

1. A sensing system comprising:
   a plurality of resistive elements coupled to a plurality of nodes and disposed at a thermal system;
   a plurality of switches coupled to the plurality of nodes, wherein a switch from among the plurality of switches is operable to couple a node from among the plurality of nodes to a return, a power, or an open circuit condition; and
   a control system coupled to and configured to operate the plurality of switches, wherein:
      the control system is configured to index through a plurality of modes to measure an electrical characteristic for each of the plurality of resistive elements by operating the plurality of switches, wherein each mode of the plurality of modes represents a different combination of power, return, or open circuit condition applied to each of the plurality of nodes, and
      the control system is configured to calculate, for each of the modes, a total power consumed by the sensing system and a power consumed by each of the plurality of resistive elements based on the measured electrical characteristic, to determine a physical parameter of the thermal system.

2. The sensing system of claim 1, wherein the control system is configured to calculate the resistances of the plurality of resistive elements based on the total power consumed, the power consumed by each of the resistive elements, and pre-stored algorithms.

3. The sensing system of claim 2, wherein the control system is configured to determine at least one of temperature, strain, light intensity, or gas concentration as the physical parameter of the sensing system based on the calculated resistances.

4. The sensing system of claim 3, wherein the control system is configured to determine the physical parameter based on the calculated resistances and predetermined correlation information that associates one or more resistance values to one or more values of the physical parameter.

5. The sensing system of claim 3, wherein the control system uses Moore-Penrose pseudoinverse to calculate the resistances of the plurality of resistive elements.

6. The system of claim 1, wherein the control system is configured to test for an open or short circuit condition.

7. The system of claim 1, wherein the control system is configured to compute derivative sensor information.

8. The sensing system of claim 1, wherein the control system is configured to determine exceeding temperature ranges of the sensing system.

9. The sensing system of claim 1, wherein the electrical characteristic includes voltage and current.

10. The sensing system of claim 1, wherein the control system is configured to calculate a total conductance of the plurality of resistive elements based on the total power consumed by the system and the power consumed by each of the resistive elements.

11. The sensing system of claim 1, wherein the number of plurality of modes is greater than or equal to the number of resistive elements.

12. The sensing system of claim 1, wherein each of the resistive elements is connected between a pair of nodes from the plurality of nodes.

13. The sensing system of claim 1, wherein the resistive elements are comprised of an electrically conductive material with a temperature dependent electrical resistance.

14. The sensing system of claim 1, wherein each mode of the plurality of modes has a set of voltages that are linearly independent of each other.

15. The sensing system of claim 1, wherein the control system is configured to communicate at least one of the electrical characteristic or the physical parameter to an external device by way of a network controller.

16. A method for measuring a physical parameter of a thermal system using a sensing system having a plurality of resistive elements coupled to a plurality of nodes, the method comprising:
indexing through a plurality of modes to measure an electrical characteristic for each of the plurality of resistive elements, wherein each mode of the plurality of modes represents a different combination of power, return, or open circuit condition applied to each of the plurality of nodes; and
calculating, for each of the modes, a total power consumed by the sensing system and a power consumed by each of the plurality of resistive elements based on the measured electrical characteristic, to determine the physical parameter of the thermal system.

17. The method of claim 16 further comprising:
calculating the resistances of the plurality of resistive elements based on the total power consumed by the sensing system and the power consumed by each of the plurality of resistive elements; and
determining the physical parameter based on the resistances of the plurality of resistive elements and predetermined correlation information that associates one or more resistance value to one or more values of the physical parameter.

18. The method of claim 17, wherein the resistances of the plurality of resistive elements are calculated using Moore-Penrose pseudoinverse.

19. The method of claim 17, wherein the physical parameter is at least one of temperature, strain, light intensity, or gas concentration.

20. The method of claim 16, wherein the electrical characteristic includes voltage and current.

21. The method of claim 16 further comprising calculating a total conductance of the plurality of resistive elements based on the total power consumed by the sensing system and the power consumed by each of the resistive elements.

22. The method of claim 16, wherein each of the resistive elements is connected between a pair of nodes from the plurality of nodes.

23. The method of claim 16 further comprising determining exceeding temperature ranges of the sensing system.

24. The method of claim 16 further comprising testing for an open or short circuit condition.

25. The method of claim 16 further comprising computing derivative sensor information.

26. The method of claim 16, wherein each mode has a set of voltages that are linearly independent of each other.

* * * * *